(12) United States Patent
Lu et al.

(10) Patent No.: US 7,001,669 B2
(45) Date of Patent: Feb. 21, 2006

(54) PROCESS FOR THE PREPARATION OF METAL-CONTAINING NANOSTRUCTURED FILMS

(75) Inventors: Yunfeng Lu, New Orleans, LA (US); Donghai Wang, New Orleans, LA (US)

(73) Assignee: The Administration of the Tulane Educational Fund, New Orleans, LA (US)

( * ) Notice: Subject to any disclaimer, the term of this patent is extended or adjusted under 35 U.S.C. 154(b) by 133 days.

(21) Appl. No.: 10/328,631

(22) Filed: Dec. 23, 2002

(65) Prior Publication Data

US 2004/0118698 A1 Jun. 24, 2004

(51) Int. Cl.
*B32B 5/00* (2006.01)

(52) U.S. Cl. .............. 428/613; 428/304.4; 148/430

(58) Field of Classification Search .......... 428/613, 428/605, 608, 304.4; 205/67, 75, 224; 148/518, 148/537, 430
See application file for complete search history.

(56) References Cited

U.S. PATENT DOCUMENTS

| | | | |
|---|---|---|---|
| 2,616,165 A * | 11/1952 | Brennan .................. 428/613 |
| 4,077,853 A * | 3/1978 | Coll-Palagos ............ 205/75 |
| 4,977,038 A * | 12/1990 | Sieradzki et al. ......... 428/610 |
| 5,849,215 A | 12/1998 | Gin et al. |
| 6,129,901 A | 10/2000 | Moskovits et al. |
| 6,136,704 A | 10/2000 | Maya |
| 6,187,165 B1 | 2/2001 | Chien et al. |
| 6,203,925 B1 | 3/2001 | Attard et al. |
| 6,218,050 B1 | 4/2001 | Yoon et al. |
| 6,231,744 B1 | 5/2001 | Ying et al. |
| 6,334,856 B1 | 1/2002 | Allen et al. |
| 6,365,266 B1 | 4/2002 | MacDougall et al. |
| 6,395,230 B1 | 5/2002 | Guerin et al. |
| 6,409,907 B1 | 6/2002 | Braun et al. |
| 6,423,411 B1 | 7/2002 | Balkus, Jr. et al. |
| 6,465,052 B1 | 10/2002 | Wu |
| 6,565,763 B1 * | 5/2003 | Asakawa et al. ............ 216/56 |
| 6,805,972 B1 * | 10/2004 | Erlebacher et al. ........ 428/613 |
| 2002/0034626 A1 | 3/2002 | Liu, et al. |
| 2002/0034827 A1 | 3/2002 | Singh, et al. |
| 2002/0055239 A1 | 5/2002 | Tuominen, et al. |
| 2002/0102396 A1 | 8/2002 | MacDougall, et al. |
| 2002/0118027 A1 | 8/2002 | Routkevitch, et al. |
| 2002/0119455 A1 | 8/2002 | Chan |
| 2002/0138049 A1 | 9/2002 | Allen, et al. |
| 2002/0146745 A1 | 10/2002 | Natan, et al. |

(Continued)

FOREIGN PATENT DOCUMENTS

EP    1 123 753 A2    8/2001

(Continued)

OTHER PUBLICATIONS

Michael H. Huang, et al., "Ag Nanowire Formation Within Mesoporous Silica," *Chem. Commun.*, pp. 1063-1064 (2000).

(Continued)

*Primary Examiner*—John J. Zimmerman
(74) *Attorney, Agent, or Firm*—Olson & Hierl, Ltd.

(57) ABSTRACT

Metal-containing nanostructured films are prepared by electrodepositing a metal-containing composition within the pores of a mesoporous silica template to form a metal-containing silica nanocomposite. The nanocomposite is annealed to strengthen the deposited metal-containing composition. The silica is then removed from the nanocomposite, e.g., by dissolving the silica in an etching solution to provide a self-supporting metal-containing nanostructured film. The nanostructured films have a nanowire or nanomesh architecture depending on the pore structure of the mesoporous silica template used to prepare the films.

3 Claims, 10 Drawing Sheets

U.S. PATENT DOCUMENTS

2002/0158342 A1   10/2002   Tuominen, et al.
2003/0075445 A1*   4/2003   Woudenberg et al. ...... 204/451
2004/0261500 A1*   12/2004   Ng et al. .................... 73/31.05

FOREIGN PATENT DOCUMENTS

| | | |
|---|---|---|
| EP | 0 993 512 B1 | 8/2002 |
| WO | WO 98/48456 | 10/1998 |
| WO | WO 99/00536 | 1/1999 |
| WO | WO 99/64580 | 12/1999 |
| WO | WO 00/14307 | 3/2000 |
| WO | WO 01/25510 A1 | 4/2001 |
| WO | WO 02/42201 A1 | 5/2002 |
| WO | WO 02/080280 A1 | 10/2002 |

OTHER PUBLICATIONS

G. Schider, et al., "Optical Properties of Ag and Au Nanowire Gratings," *Journal of Applied Physics*, 90 (8), pp. 3825-3830 (Oct. 15, 2001).

Kyung-Bok Lee, et al., "Size-Controlled Synthesis of Pd Nanowires Using a Mesoporous Silica Template via Chemical Vapor Infiltration,"*Advanced Materials*, 13 (7), pp. 517-520 (Apr. 4, 2001).

A. J. Yin, et al., "Fabrication of Highly Ordered Metallic Nanowire Arrays by Electrodeposition," *Applied Physics Letters*, 79 (7), pp. 1039-1041 (Aug. 13, 2001).

Yong-Jin-HAN, et al., "Preparation of Noble Metal Nanowires Using Hexagonal Mesoporous Silica SBA-15," *Chem. Mater.*, 12 (8), pp. 2068-2069 (2000).

I. A. Aksay, et al., "Biomimetic Pathways for Assembling Inorganic Thin Films," *SCIENCE*, 273, pp. 892-898 (Aug. 16, 1996).

Anne Galarneau, et al., "True Microporosity and Surface Area of Mesoporous SBA-15 Silicas as a Function of Synthesis Temperature," *Langimuir*, 17 (26), pp. 8328-8335 (2001).

Yunfeng Lu, et al., "Evaporation-Induced Self-Assembly of Hybrid Bridged Silsesquioxane Film and Particulate Mesophases With Integral Organic Functionality," *J. Am. Chem. Soc.*, 122 (22), pp. 5258-5261 (2000).

N. A. Melosh, et al., "Molecular and Mesoscopic Structures of Transparent Block Copolymer-Silica Monoliths," *Macromolecules*, 32 (13), pp. 4332-4342 (1999).

Wen-Hua Zhang, et al., "Synthesis and Characterization of Nanosized ZaS Confined in Ordered Mesoporous Silica," *Chem. Mater.*, 13 (2) pp. 648-654 (2001).

Martinus H. V. Werts, et al., "Nanometer Scale Patterning of Langmuir-Blodgett Films of Gold Nanoparticles by Electron Beam Lithography," *Nano Letters*, 2 (1), pp. 43-47 (2002).

Frédéric Favier, et al., "Hydrogen Sensors and Switches from Electrodeposited Palladium Mesowire Arrays," *SCIENCE*, 293 (5538), pp. 2227-2231 (Sep. 21, 2001).

J. I. Pascual, et al., "Properties of Metallic Nanowires: From Conductance Quantization to Localization," *SCIENCE*, 267 (5205), pp. 1793-1795 (Mar. 24, 1995).

Sheila R. Nicewarner-Peña, et al., "Submicrometer Metallic Barcodes," *SCIENCE*, 294 (5540), pp. 137-141 (Oct. 5, 2001).

T. Thurn-Albrecht, et al., "Ultrahigh-Density Nanowire Arrays Grown in Self-Assembled Dibock Copolymer Templates," *SCIENCE*, 290 (5499), pp. 2126-2129 (Dec. 15, 2000).

Michael P. Zach, et al., "Molybdenum Nanowires by Electrodeposition," *SCIENCE*, 290 (5499), pp. 2120-2123 (Dec. 15, 2000).

George S. Attard, et al., "Mesoporous Platinum Films from Lyotropic Liquid Crystalline Phases," *SCIENCE*, 278 (5339), pp. 838-840 (Oct. 31, 1997).

Yunfeng, Lu, et al., Continuous Formation of Supported Cubic and Hexagonal Mesoporous Films by Sol-Gel Dip-Coating, *NATURE*, 389 (6649), pp. 364-368 (Sep. 25, 1997).

\* cited by examiner

PROCESS FOR THE PREPARATION OF METAL-CONTAINING NANOSTRUCTURED FILMS

FIELD OF THE INVENTION

This invention relates generally to processes for preparation of metal-containing nanostructured films. More particularly the invention relates to processes for the preparation of metal and metal chalcogenide nanostructured films by electrochemically depositing a metallic composition within a template.

BACKGROUND

Thin films of metals and semiconductors (e.g., metal chalcogenides such as CdSe and CdTe) are assuming vital roles in advanced technologies such as nanotechnology. Improved performance of thin-film-based devices, such as nano-scale sensors, magnetic storage media, nano-scale optical devices, and the like, can often be achieved through precise control of the film structure on an atomic to nanometer scale.

Methods of film processing can be divided into two major categories: those carried out in a gas phase (i.e., "dry processes") and those carried out in a liquid phase (i.e., "wet processes"). The dry processes include, for example, techniques such as vacuum evaporation, chemical vapor deposition (CVD), molecular beam epitaxy (MBE), and sputtering. These techniques generally require high vacuum and/or high temperatures to produce gaseous precursor molecules or atoms, which are then condensed onto a substrate to form a film. Because unwanted chemical species can generally be excluded from the system, the gas-phase techniques can provide high precisely controlled film growth and highly pure materials, however such techniques generally require, expensive, specialized equipment.

Among the wet processes, methods employing chemical and electrochemical reactions in water and in non-aqueous solvents have been used to fabricate structured, thin films. Useful wet methods include chemical bath deposition (CBD), and electrochemical deposition (i.e., electrodeposition or ED). Electrodeposition is widely used for the preparation of decorative and functional coatings, in electronics manufacture, and for the electrochemical fabrication of micro-electromechanical systems. Advantageously, ED also is compatible with relatively simple and inexpensive processing equipment.

With recent developments in nanotechnology, nanostructured thin films have garnered increased interest. Template-based synthesis is one of most efficient approaches to preparing nanostructured thin film materials such as metal and semiconductor nanowire arrays, and the like. Electrodeposition of a metal or semiconductor within a porous template provides a flexible and easily controllable way to fabricate continuous, macroscopic nanostructured arrays as thin films. The electrochemical deposition of a metal occurs at the surface of an electrode and the nanostructured metal grows to fill the pores of the template. The nanostructured thin film can then separated from the template, if desired. So-called "hard" templates, such as alumina and polycarbonate, and "soft" templates, such as liquid crystal materials, have been utilized as templates for electrodeposition of metals to form metal nanostructured materials.

A variety of nanostructures materials have been electrochemically deposited within porous alumina and polycarbonate templates providing arrays of nano-scale wires (i.e., nanowires) having diameters of about 20 to 250 nanometers and with lengths of about 1 to 10 millimeters. Nanostructured materials which have been prepared by theses template-directed methods include nanowires of metals such as Au, Ag, Co, Cu, Ni, Pd, and Pt, semiconductors such as CdS, CdSe, InP, GaAs, and conductive polymers.

Colloidal semiconductor nanocrystals, passivated with organic surfactants and size-selected to a very high degree, spontaneously precipitate out of solution and form three-dimensional arrays of nano-scale crystals (i.e., quantum dots) In this configuration, the array of quantum dots form a quantum dot "crystal" or superlattice array. The strength of the electronic coupling between adjacent dots can be tuned by variation of the organic passivating coating around the dots. Electron transfer within such superlattice arrays results from inter-dot tunneling, which can limit the usefulness of such materials in solar cells, for example.

Semiconductor thin films have been prepared by electrodeposition. Reported electrodeposition of crystalline, group II–VI semiconductor compounds include, for example, galvanostatic electrodeposition of cadmium selenide from a dimethylsulfoxide (DMSO) solution of a cadmium salt and elemental selenium at a temperature of about 185° C.; and potentiostatic deposition of cadmium selenide from an aqueous solution of a cadmium salt and selenous acid at a pH of about 2–2.5. Electrochemical atomic layer epitaxy has also been used to deposit semiconductor thin films. Group III–V semiconductor compounds have been electrodeposited from aqueous solutions or molten salts.

Mesoporous silica has also been utilized as a template material for preparation of nanostructured materials. Various synthetic methods have been developed to produce mesoporous silica with a variety of morphological and topological characteristics including hexagonal mesoporous materials with parallel arrays of relatively uniform diameter cylindrical pores, as well as cubic mesoporous materials having interconnected pore structures. These methods are typically inexpensive and afford templates with readily controllable pore structures.

A number of different nanostructured materials, such as polymers, metals, metallic alloys, semiconductors, and other inorganic compounds, have been synthesized in mesoporous silica templates utilizing non-electrochemical methods, however, there have been no reports of electrodeposition of metals or metal chalcogenides in mesoporous silica templates.

Metal-containing nanostructured films, such as, metal chalcogenide semiconductor nanomesh or nanowire thin films, are useful for preparing nanocrystal-based light-emitting diodes (LEDs) and photoinduced electron transfer devices, for example.

In many cases, nanostructured thin film materials are relatively weak, structurally, which can limit their utility. For example, upon removal of the template from a template synthesized nanostructured thin film, the resulting template-free film can lack mechanical strength and structural integrity (i.e., it can fall apart without external support from a substrate). This can limit the utility of nanostructured thin films in many applications.

There is an ongoing need, therefore, for improved methods of making self-supporting, metal-containing nanostructured thin films, such as metal and metal chalcogenide nanowire and nanomesh thin films, having suitable structural integrity and mechanical strength for use in devices such as solar cells, chemical sensors, and the like. The present invention fulfills this need.

SUMMARY OF THE INVENTION

Metal-containing nanostructured films are prepared by electrodepositing a metallic composition within the pores of a mesoporous silica template to form a metal-containing silica nanocomposite. The nanocomposite is annealed to strengthen the deposited metallic composition, preferably at a temperature in the range of about 25% to about 70% of the melting temperature of the deposited metallic composition (measured in degrees Celsius). The silica is then removed from the nanocomposite, e.g., by dissolving in a suitable etching solution such as hydrofluoric acid, to provide a self-supporting, metal-containing nanostructured film. The metal-containing nanostructured films of the present invention have sufficient structural integrity and mechanical strength to remain self-supporting after removal of the silica template.

Metal and metal chalcogenide nanowire thin films of the present invention are composed of ordered arrays of nanometer-scale diameter wires, the dimensions of which are controlled by the dimensions of the pores in the mesoporous silica template used to prepare the film. Nanowire structures are prepared from hexagonal or swirled mesoporous silica templates having substantially parallel arrays of straight pores, or nested, curled pores, respectively.

In nanomesh embodiments, the mesh is composed of a continuous, interconnected, porous nanofiber network having segments with nanometer-scale cross-sectional dimension. Nanomesh structures are prepared from cubic mesoporous silica templates having a network of substantially three-dimensionally interconnected pores.

A mesoporous silica film is prepared by depositing a surfactant micelle-templated silica sol onto an electrically conductive substrate and calcining the deposit to provide a surfactant-free mesoporous silica film. The pore structure of the film is controlled by the choice of surfactant and the surfactant concentration, for example, as is well known in the art. The film is deposited on a conductive metal surface, such as a film of copper, gold, or silver to provide an electrode for electrodeposition of the metallic composition such as a metal or metal chalcogenide, within the pores of the film. The film, with its conductive substrate, is immersed in a solution of metal ion (or a metal complex) or a solution of metal ion (or a metal complex) and an elemental chalcogen (e.g., sulfur, selenium, or tellurium), and a voltage potential is applied between the conductive substrate (working electrode) in contact with the mesoporous silica template and a counter electrode in the solution. The nanowires grow in a single direction, starting from the conductive metal surface and growing outward through the pores of the silica, forming a nanocomposite of silica and metal or metal chalcogenide.

The nanocomposite is then annealed to impart structural integrity and strength to the metal or metal chalcogenide materials. The silica is removed by dissolving the silica in an etching solution such as hydrofluoric acid. The resulting metal-containing nanostructured film is substantially free of silica, and has enough structural integrity to be self-supporting.

The metal chalcogenide nanostructured thin films of the present invention are particularly useful as photoelectric components such as solar cells, photovoltaic devices, and the like, and metal nanostructured films are useful as sensors, catalytic membranes, and information storage media.

DETAILED DESCRIPTION OF PREFERRED EMBODIMENTS

Figure 1:
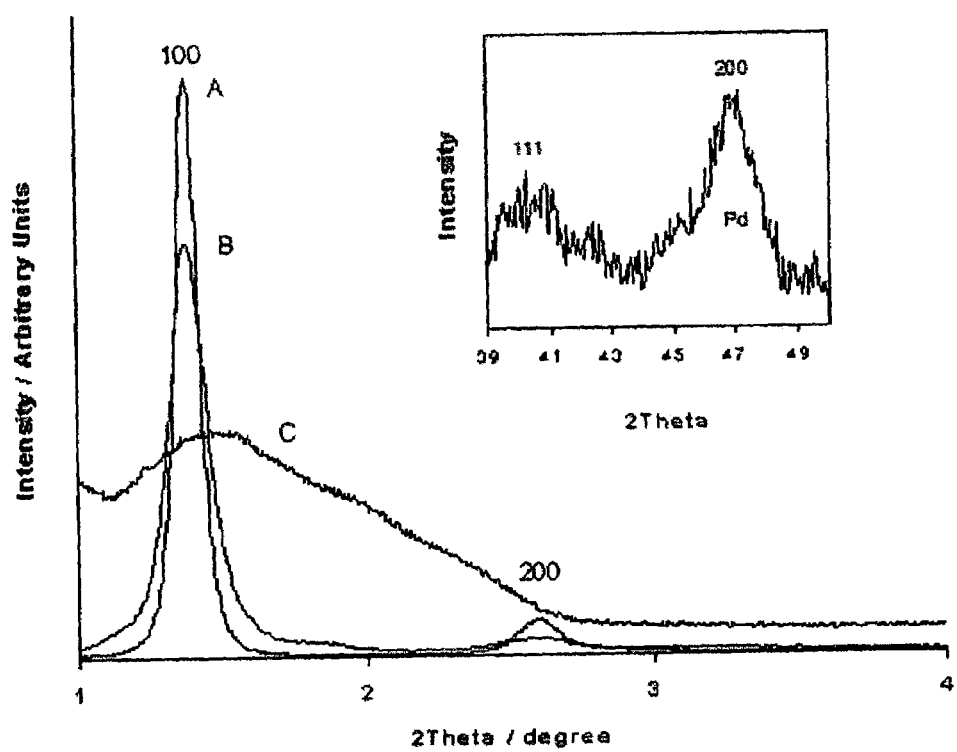
FIG. 1 depicts the x-ray diffraction (XRD) patterns, at low theta angle (2-theta of about 1 to about 4 degrees), of a hexagonal mesoporous silica thin film prepared using a EO-PO-EO triblock copolymer surfactant PLURONIC® P123 from BASF (trace A), a silica-palladium nanocomposite after annealing (trace B), and a palladium nanowire film after removal of the silica template from the nanocomposite (trace C); the inset shows the XRD pattern of the nanocomposite at relatively high theta angles (2-theta angle of about 39 to about 50 degrees)

The metal-containing nanostructured films of the present invention are prepared from a novel electrodepostion and annealing process wherein a metallic composition, such as a metal or metal chalcogenide, is electrodeposited in the pores of a mesoporous silica template to form a metal-containing silica nanocomposite, subsequently annealing the nanocomposite, and then removing the silica therefrom to afford a self-supporting, metal-containing nanostructured film. The nanostructured film preferably has a nanowire-array type structure or a nanomesh structure. The nanostructure of the film is directly controlled by the pore structure of the mesoporous silica template used to prepare the film.

Any metal that is amenable to electrochemical deposition can be deposited within the pores of the template. Preferred metals include transition metals such as molybdenum, nickel, palladium, platinum, copper, silver, gold, zinc, cadmium, and alloys thereof; and main group (e.g, Group III, IV and V) metals such as boron, aluminum, germanium, arsenic, lead, antimony, bismuth, and alloys thereof. Palladium is a particularly preferred transition metal.

In another preferred embodiment, the metallic composition comprising the nanostructured film is a metal chalcogenide, such as a metal oxide, sulfide, selenide, or telluride. Preferably the chalcogenide is a sulfide, selenide,. or telluride. Preferred metallic components of the metal chalcogenides include cadmium, copper, zinc, lead, germanium, antimony, and bismuth. Most preferably the metal chalcogenide is a semiconducting metal chalcogenide such as cadmium selenide, cadmium telluride, cadmium sulfide, lead selenide, and the like.

As used herein and in the appended claims, the term "electrodeposition" and grammatical variations thereof, as applied to a metallic composition, refers to the use of an electrochemical redox reaction to deposit a solid metallic composition such as a metal or metal chalcogenide from an aqueous or non-aqueous solution. The metallic composition can be deposited, for example, from a solution of a metal ion, a combination of metal ions, a combination of metal ion and elemental chalcogen, metal ion and chalcogen oxide (e.g., selenium dioxide) and the like, as is well known in the art.

Metals are preferably deposited from an aqueous solution of metal ions, whereas a metal chalcogen is preferably deposited from a solution of metal ion and elemental chalcogen or a chalcogen oxide in a non-aqueous solvent. Preferred non-aqueous solvents include polar aprotic solvents such as dimethylsulfoxide, dimethylformamide, formamide, N-methylpyrrolidone, N,N'-dimethyl methyleneurea, and the like. Dimethylsulfoxide is a particularly preferred polar aprotic non-aqueous solvent.

In order to complete an electrochemical circuit for deposition of the metallic composition within the pores of the template, at least one porous surface of the mesoporous silica film template must be in contact with an electrically conductive material. Any conductive material can be used. Preferably the conductive material is a conductive metal such as aluminum, copper, silver, gold, and platinum. The conductive material can be in the form of a metal substrate, a film on a non-conducting substrate, and the like. A preferred substrate is a glass or polymeric (i.e., plastic) substrate having a conductive metal coating. Alternatively, the substrate can be a conductive organic or inorganic composition, such as indium tin oxide.

As used herein and in the appended claims, the term "annealing" and grammatical variations thereof, as applied to a metal-containing silica nanocomposite film, refers to thermal treatment of the film to improve the mechanical strength, structural integrity, and cohesiveness of the film, so that the film will be self-supporting in the absence of the silica. Preferably, a metal-containing silica nanocomposite is annealed at a temperature in the range of about 25 to about 70% of the melting temperature of the metallic composition (e.g., metal or metal chalcogenide) that has been electrodeposited within the pores of the mesoporous silica template. For metals, the preferred temperature range is not more than about 40% of the melting temperature of the metal (in ° C.), more preferably in the range of about 30% to 35% of the melting temperature. For metal chalcogenides, the preferred annealing temperature is in the range of about 30% to about 70% of the melting temperature of the metal chalcogenide (in ° C.) more preferably about 50% to about 60% of the melting temperature. Generally, annealing decreases crystal defects in the metal or metal chalcogenide nanostructures, and may also produce some localized changes in the crystal point group.

The temperature of the nanocomposite is maintained at the annealing temperature for a time period sufficient to afford a self-supporting metallic nanostructured film after removal of the silica from the nanocomposite. Typically the annealing temperature is maintained for a period of at least about 10 minutes to about 60 minutes. The annealing temperature and time period will generally vary with the metal-containing component of the nanocomposite.

In a preferred palladium nanostructured film embodiment, a palladium silica nanocomposite preferably is annealed at a temperature in the range of about 350 to about 450° C. for at least about 30 minutes. In a preferred cadmium selenide nanostructured film embodiment, a cadmium selenide silica nanocomposite preferably is annealed at a temperature in the range of about 600 to about 700° C. for at least about 15 minutes.

Mesoporous silica is a superior templating material for preparation of useful metal-containing nanostructured films. Any mesoporous silica film can be used as a template to prepare the metal-containing nanostructured films of the present invention. As used herein and in the appended claims, the term "mesoporous" as applied to porous silica materials refers to a silica having pore sizes in the range of about 0.8 to about 20 nanometers (about 8 to about 200 Angstroms). Mesoporous silica is well known in the art. Particularly preferred mesoporous silica materials for use as a templates to prepare the metal-containing nanostructured films of the present invention, and methods of preparing mesoporous silica films, are described in U.S. Pat. No. 5,858,457 to Brinker et al., the disclosure of which is incorporated herein by reference. The mesoporous silica films preferably have a film thickness in the range of about 50 nm to about 1000 nm.

The mesoporous silica templates can be prepared from anionic surfactants, such as sodium lauryl sulfate (SLS), and the like; cationic surfactants, such as cetyltribenzylammonium chloride, cetyltribenzylammonium bromide, and the like; and nonionic surfactants such as block copolymers of ethylene oxide and propylene oxide (i.e., EO/PO block copolymers),), surfactants containing hydrophobic alkyl chain and hydrophilic ethylene oxide blocks such as BRIJ® surfactants available from Uniqema-Americas, Wilmington, Del., and the like, as is well known in the art.

Preferred mesoporous silicas include hexagonal mesoporous silica, swirled mesoporous silica, and cubic mesoporous silica. Hexagonal mesoporous silica has a pore structure having a one-dimensional array of substantially straight tubular (i.e., cylindrical) pores of substantially uniform diameter, resembling a stack of pipes in cross-section. Cubic mesoporous silica has a three-dimensional pore structure with substantially interconnecting pores. Swirled mesoporous silica has a "swirled" mesopore structure, comprising nested, curled, tubular pores.

Silica can be removed from the nanocomposite by any method that does not disrupt the integrity of the resulting metal-containing nanostructured film. Preferably the silica is dissolved with an etching solution under conditions that will not materially affect the metallic portion of the nanocomposite. Preferred etching compositions include dilute hydrofluoric acid (about 0.1 weight percent to about 10 weight percent concentration of HF in water), fluoride ion-containing solutions, and the like.

When a metal or metal chalcogenide is electrodeposited within the pores of a hexagonal mesoporous silica template, a nanocomposite of silica having an array of metal or metal chalcogenide nanowires is formed due to the uniform array of cylindrical pores of the silica template. After removal of the silica, the nanowire film typically has a film thickness in the range of about 50 nm to about 1000 nm, and the individual nanowires of the film have diameters in the range of about 2 nm to about 20 nm, preferably about 3 nm to about 10 nm. The diameters of the nanowires and the film thickness are controlled, for example, by the choice of surfactant and surfactant concentration used to prepare the mesoporous silica template and by the coating conditions.

When a metal or metal chalcogenide is electrodeposited within the pores of a swirled mesoporous silica template, a nanocomposite of silica having an array of nested, curled, metal or metal chalcogenide nanowires is formed due to the swirled array of tubular pores of the silica template. After removal of the silica, the nanowire film typically has a film thickness in the range of about 50 nm to about 1000 nm, and the individual nanowires of the film have a transverse (i.e., cross-sectional) dimension in the range of about 2 nm to about 20 nm, preferably about 3 nm to about 10 nm. The transverse dimension of the nanowires and the film thickness are both controlled by the mesoporous silica template as described above.

When a metal or metal chalcogenide is electrodeposited within the pores of a cubic mesoporous silica template, a nanocomposite of silica having an interconnected metal or metal chalcogenide nanofiber network forms due to the interconnected nature of the pores of the silica template. After removal of the silica, a nanomesh thin film is provided, which is composed of a network of substantially interconnected nanosegments of controlled size. The nanomesh thin film typically has a film thickness in the range of about 50 nm to about 1000 nm. The transverse dimension and segment length of the nanosegments of the film are controlled by the pore size and degree of interconnectedness of the pores in the template. The nanosegments typically have a transverse dimension in the range of about 2 nm to about 20 nm. The pores of the nanomesh film are formed by removal of the silica from the nanocomposite, i.e., areas of silica in the nanocomposite become pores in the nanomesh film The following non-limiting examples are provided to further illustrate preferred embodiments of the invention.

EXAMPLE 1

Preparation of a Hexagonal Mesoporous Silica Template

Hexagonal mesoporous silica films were prepared by spin-coating a silicate/surfactant sol on conductive glass substrates (TEC GLASS™ slides from Pilkington, PLC, St. Helens, UK; 1 inch by 1 inch dimensions). The sols were prepared by mixing tetraethoxy silane, water, PLURONIC® P123 nonionic EO/PO block copolymer surfactant (BASF Corp., Mount Olive, N.J.), hydrochloric acid (0.1–2N) and ethanol in a molar ratio of about 1:5:0.0096:0.0089:22, respectively, at room temperature for about 30 minutes in a flask. The sols were spin-coated or dip coated onto the conductive glass slides. At total of about 10 mg of the sol was deposited on each plate to afford a coating thickness of about 300 to about 500 nm. The plates were dried at about 25° C. for about 5 hours. The coated plates were then calcined at about 400° C. for about 2 hours to burn off the surfactant and provide a hexagonal mesoporous silica coated plates. The resulting mesoporous silica films had a thickness in the range of about 200 nm to about 500 nm, and pore dimensions of about 47 to about 89 Å, as determined by nitrogen absorption measurement using the Barrett, Joyner and Halenda (BJH) method of determining pore size distribution, Barrett et al., *J. Am. Chem. Soc.,* 1951, 73, 373.

EXAMPLE 2

Preparation of a Palladium Nanowire Thin Film

Hexagonal mesoporous silica coated plates (templates) from Example 1 were immersed in a solution of $PdCl_2$ (about 0.5 weight %) in aqueous hydrochloric acid (about 1N). Electrodeposition of palladium metal within the pores of the template to form a palladium silica nanocomposite was performed by applying voltage difference across a circuit including the conductive surface of the template as the working electrode, platinum wire as the counter-electrode, and a standard Ag/AgCl reference electrode. A constant current density in the range of about 1 to about 20 milliamps per square centimeter ($mA/cm^2$) was applied for a period of about 10 to about 30 minutes. The palladium silica nanocomposite coated plates were annealed at a temperature of about 400° C. for about 2 hours and then cooled to room temperature under nitrogen or forming gas (about 1% hydrogen in nitrogen).

The silica was removed from the annealed palladium silica nanocomposites by soaking the silica coated surface of the plates in a solution of aqueous hydrofluoric acid (about 2 weight %) for about 1 minute and then rinsing the plates with deionized water. Self-supporting thin films composed of palladium nanowire arrays were obtained. The films were analyzed by energy dispersive x-ray diffraction (EDX) to confirm the absence of silica in the films.

The mesoporous silica films, nanocomposites, and palladium nanowire films were characterized by XRD measurements using a Philips XPERT® X-ray diffractometer using CuKα radiation ($\lambda=0.1542$ nm). TEM images of the films were obtained using a JEOL 2010 tunneling electron microscope operated at about 200 kV, and SEM micrographs were obtained with a JEOL JSM 5410 scanning electron microscope operated at about 20 kV.

FIG. 1 shows the XRD patterns for the mesoporous silica template (trace A), the nanocomposite (trace B), and the silica free palladium nanowire film (trace C). Trace A in FIG. 1 exhibits a typical one dimensional hexagonal pattern with an intense (100) diffraction peak at a d-spacing of about 67.4 Angstroms and with a (200) peak at about 35.6 Angstroms. The nanocomposite (trace B) had a similar diffraction pattern, except for a decrease in the XRD peak intensity at low theta angle, as expected. The inset demonstrates presence of characteristic diffraction peaks for palladium, indicating the formation of Fm3m crystalline palladium within the mesoporous channels. After removal of the silica from the nanocomposite, a much broader (100) diffraction peak was observed (trace C), having a smaller d-spacing of about 59.3 Angstroms, indicating the presence of ordered arrays of palladium nanowires. A partial collapse or aggregation of the nanowires may account for the broader (100) diffraction peak, the disappearance of the (200) peak, and the decrease in d-spacing.

Figure 2:
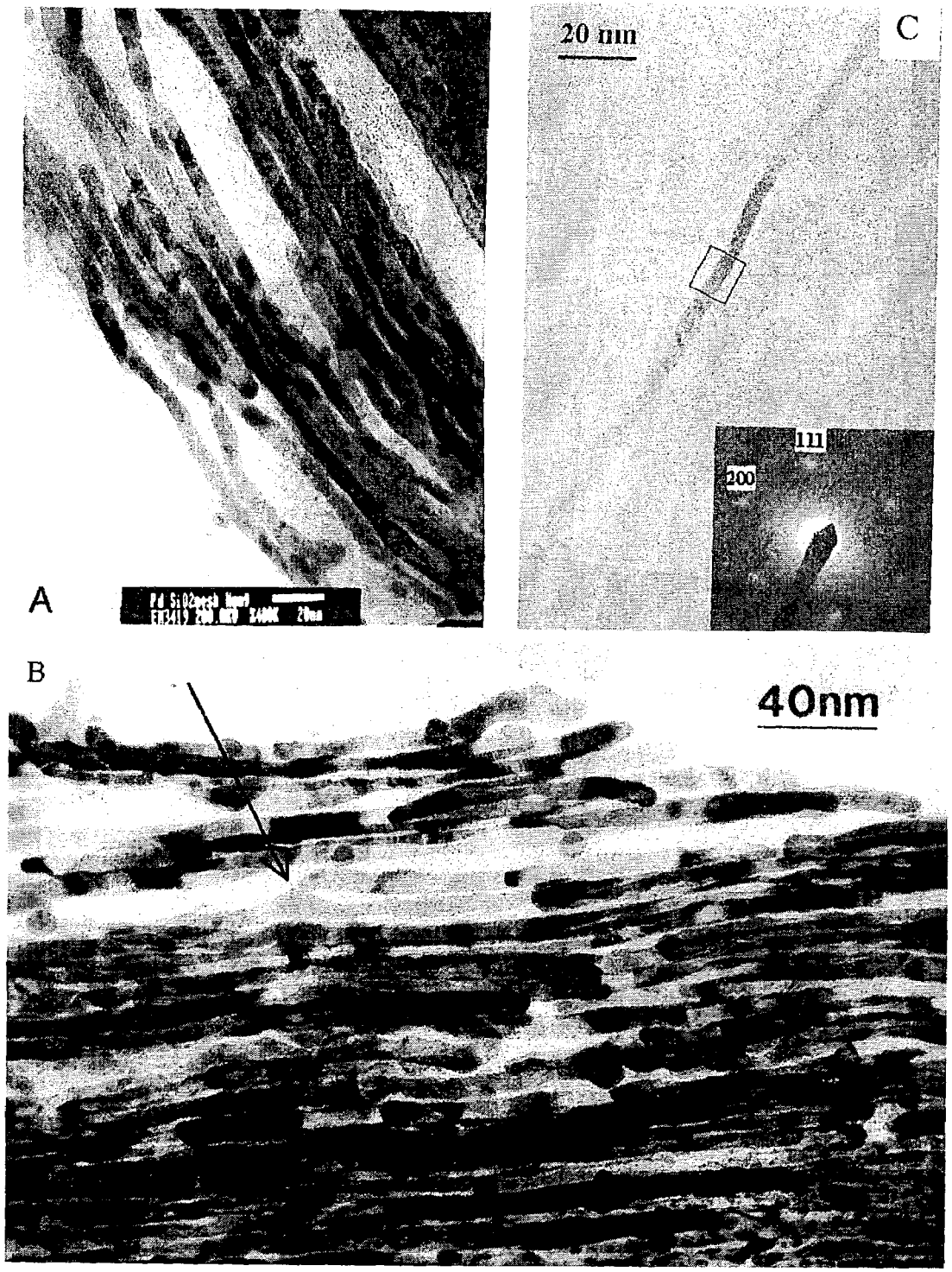
FIG. 2 depicts tunneling electron microscope (TEM) images of palladium nanowires of the invention (A and B) and of isolated nanowires (C) prepared by sonicating the film to dislodge individual wires from the array.

FIG. 2 shows TEM images of the palladium nanowire films (A and B), and of isolated palladium nanowires obtained by sonicating the films to disperse the wires (C).

Sonication was conducted by immersing the nanowire thin films in a hydrogen fluoride-containing solution to obtain a fragment of the nanowire thin film. The fragment was then placed in ethanol and sonicated for about 30 minutes. The diameter of the wires in the images are about 80 Anstroms (8 nm). A relatively minor number of interconnecting wires were observed (see arrow in FIG. 2B), probably due to minor defects in pore structure of the hexagonal mesoporous silica template. FIG. 2C shows a TEM micrograph of an isolated nanowire obtained by sonication as described above. The average length of the nanowires after sonication was greater than about 1 micrometer and the nanowires had an aspect ratio of greater than about 125 (length to diameter ratio). The inset in FIG. 2C shows an electron diffraction pattern demonstrating the presence of localized single-crystal palladium nanowires.

EXAMPLE 3

Preparation of Swirled Mesoporous Silica Templates

Swirled mesoporous silica films were prepared by spin-coating a silicate/surfactant sol on a conductive glass substrates as described in Example 1. The sols were prepared by mixing tetraethoxy silane, water, PLURONIC® P123 non-ionic surfactant, hydrochloric acid (0.1–1 N) and ethanol in a molar ratio of about 1:5:0.0096:0.0089:22, respectively, at room temperature for about 30 minutes in a flask. The sols then were spin-coated onto the conductive glass plates. At total of about 10 mg of the sol was deposited on each plate to afford a coating thickness of about 300 to about 500 nm. The plates were dried at about 25° C. for about 5 hours. The coated plates were then calcined at about 400° C. for about 2 hours to burn off the surfactant and provide a hexagonal mesoporous silica film on a conductive substrate. The resulting swirled mesoporous silica films had a thickness of about 200 to about 500 nm, and swirled pores having transverse dimension of about 4 to about 10 nm, as determined by nitrogen absorption measurement using the BJH method, as described above.

EXAMPLE 4

Preparation of Swirled Palladium Nanowire Film

Swirled mesoporous silica coated plates (templates) from Example 3 were immersed in a solution of $PdCl_2$ (about 0.5 weight %) in aqueous hydrochloric acid (about 1 N). Electrodeposition of palladium metal within the pores of the template to form a palladium silica nanocomposite was performed by applying voltage difference across a circuit including the conductive surface of the template as the working electrode, platinum wire as the counter-electrode, and a standard Ag/AgCl reference electrode. A constant current density in the range of about 1 to about 20 $mA/cm^2$ was applied for a period of about 10 to about 30 minutes. The palladium silica nanocomposite-coated plates were annealed at a temperature of about 400° C. for about 2 hours and then cooled to room temperature under nitrogen or forming gas.

The silica was removed from the annealed palladium silica nanocomposites by soaking the silica coated surface of the plates in a solution of aqueous hydrofluoric acid (about 2 weight %) for about 1 minute and then rinsing the plates with deionized water. Self-supporting thin films composed of swirled bundles of palladium nanowires were obtained. The films were analyzed by energy dispersive x-ray diffraction (EDX) to confirm the absence of silica in the films.

Figure 3:
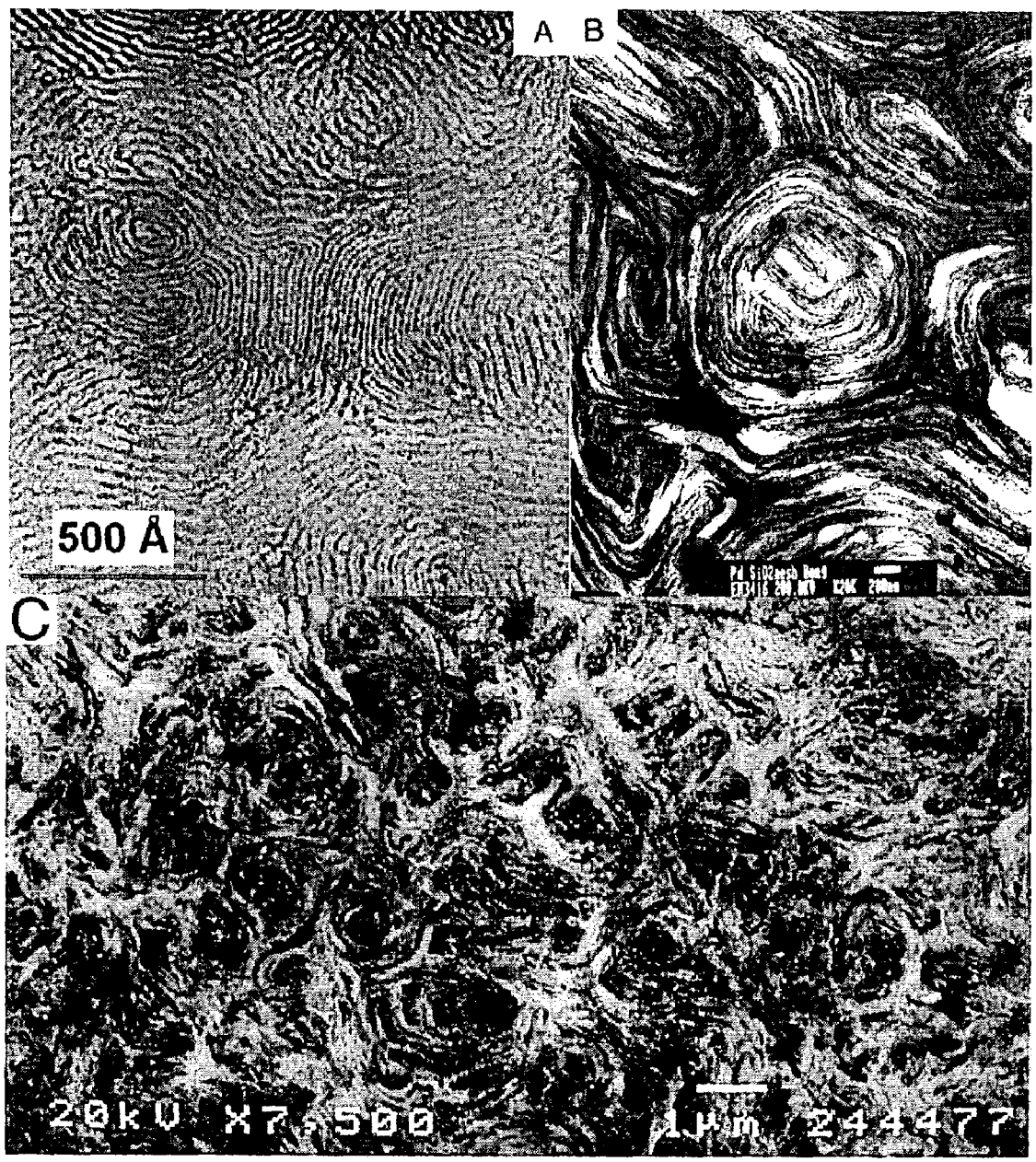
FIG. 3 depicts a TEM image of a mesoporous silica template (A), a palladium nanowire thin film of the invention (B), and a top-view, scanning electron microscope (SEM) image of a palladium nanowire thin film of the invention.

FIG. 3 shows TEM images of the swirled mesoporous silica template (A), and swirled palladium nanowire film (B). FIG. 3C shows a top-view SEM image of the swirled palladium nanowire film. As shown in FIGS. 3A and 3B, the nanowires in are assembled in nested, swirled bundles.

EXAMPLE 5

Preparation of Cubic Mesoporous Silica Templates

Cubic mesoporous silica films were prepared by spin-coating a silicate/surfactant sol on a conductive glass substrates as described in Example 1. The sols were prepared by mixing tetraethoxy silane, water, a surfactant, hydrochloric acid (0.1–1 N) and ethanol in a specified molar ratio at room temperature for about 30 minutes in a flask. The sols were spin-coated onto the conductive glass slides. At total of about 10 mg of the sol was deposited on each plate to afford a coating thickness of about 300 to about 500 nm. The plates were dried at 25° C. for about 5 hours. The coated plates were then calcined at about 400° C. for about 2 hours to burn off the surfactant and provide cubic mesoporous silica coated plates. The resulting cubic mesoporous silica films had a thickness in the range of about 300 to about 500 nm, and a network of substantially interconnected pores having transverse dimension of about 4 to about 10 nm, as determined by nitrogen absorption measurement using the BJH method.

The surfactants utilized to prepare the cubic mesoporous silica films and the molar ratios of tetraethoxy silane, water, surfactant, hydrochloric acid (1 N) and ethanol, respectively, are reported in Table 1.

TABLE 1

Cubic Mesoporous Silica Compositions

| Example | Surfactant | Silane:water:surfactant:HCl:ethanol |
| --- | --- | --- |
| 5A | PLURONIC ® F127 | 1:5:0.003:0.0089:22 |
| 5B | BRIJ ® 58 | 1:5:0.034:0.0089:22 |
| 5C | CTAB | 1:5:0.1:0.0089:22 |

In Table 1, PLURONIC ® F127 is an ethylene oxide propylene oxide tri-block copolymer having the empirical structure $EO_{120}PO_{70}EO_{120}$, available from BASF Corp., Mount Olive, NJ; BRIJ ® 58 is ethoxylated cetyl alcohol having the empirical formula $C_{16}H_{33}O(EO)_{20}$,available from Uniqema-Americas, Wilmington DE; and CTAB is cetyltribenzylammonium chloride, available from Aldrich Chemical Co., Milwaukee, WI; EO is an ethyleneoxy group and PO is a propyleneoxy group.

EXAMPLE 6

Preparation of a Palladium Nanomesh Thin Films

Cubic mesoporous silica coated plates (templates) from Example 5A, B and C were immersed in a solutions of $PdCl_2$ (about 0.5 weight %) in aqueous hydrochloric acid (about 1 N). Electrodeposition of palladium metal within the pores of the template to form a palladium silica nanocomposite was performed by applying voltage difference across a circuit including the conductive surface of the template as the working electrode, platinum wire as the counter-electrode, and a standard Ag/AgCl reference electrode. A constant current density in the range of about 1 to about 20 mA/cm$^2$ was applied for a period of about 10 to about 30 minutes. The palladium silica nanocomposites coated plates were annealed at a temperature of about 400° C. for about 2 hours and then cooled to room temperature under nitrogen or forming gas.

The silica was removed from the annealed palladium silica nanocomposites by soaking the silica coated surface of the plates in a solution of aqueous hydrofluoric acid (about 2 weight %) for about 1 minute and then rinsing the plates with deionized water. Self-supporting palladium nanomesh thin films were obtained. The films were analyzed by energy dispersive x-ray diffraction (EDX) to confirm the absence of silica in the films.

Figure 4:
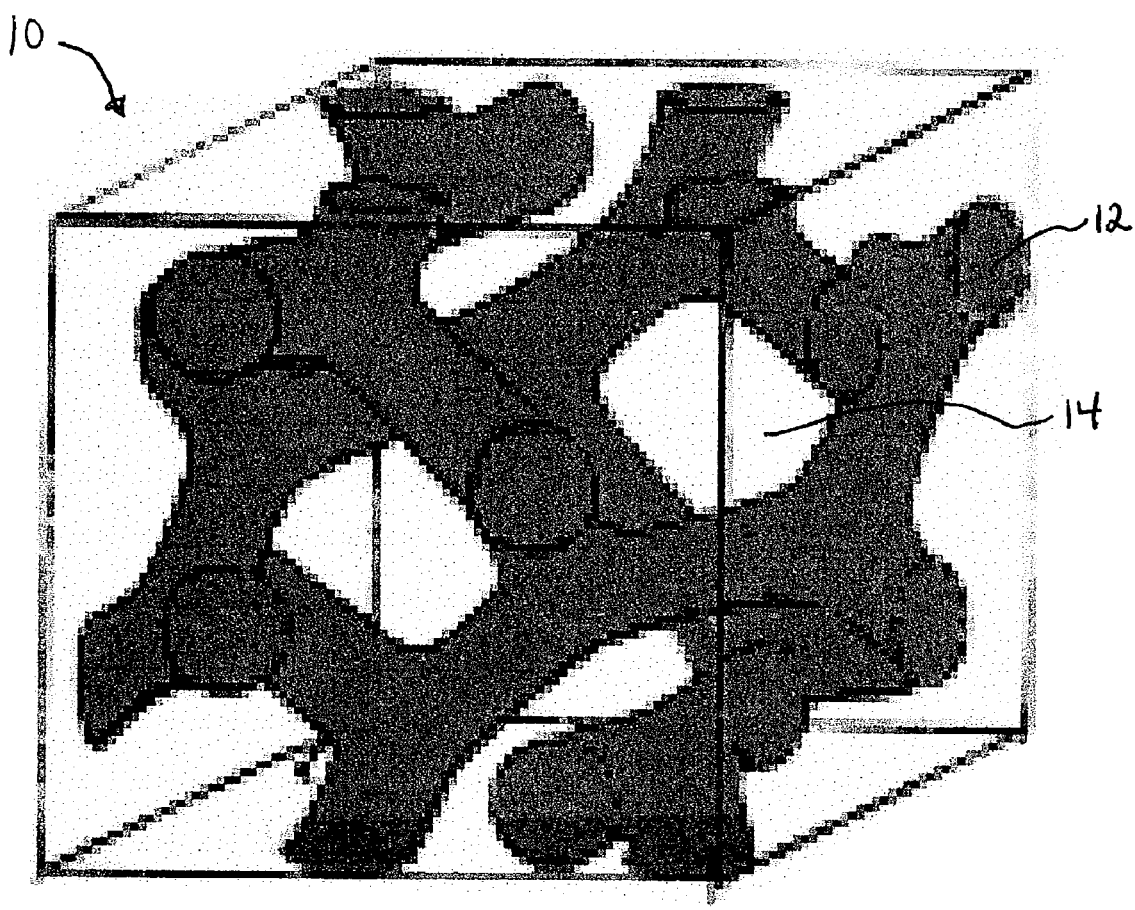
FIG. 4 is a schematic diagram of a segment of a nanomesh thin film of the present invention.

FIG. 4 is a schematic representation of a section of a nanomesh film 10 showing interconnected nanosegment network 12. The nanomesh film 10 also defines pores 14.

Figure 5:
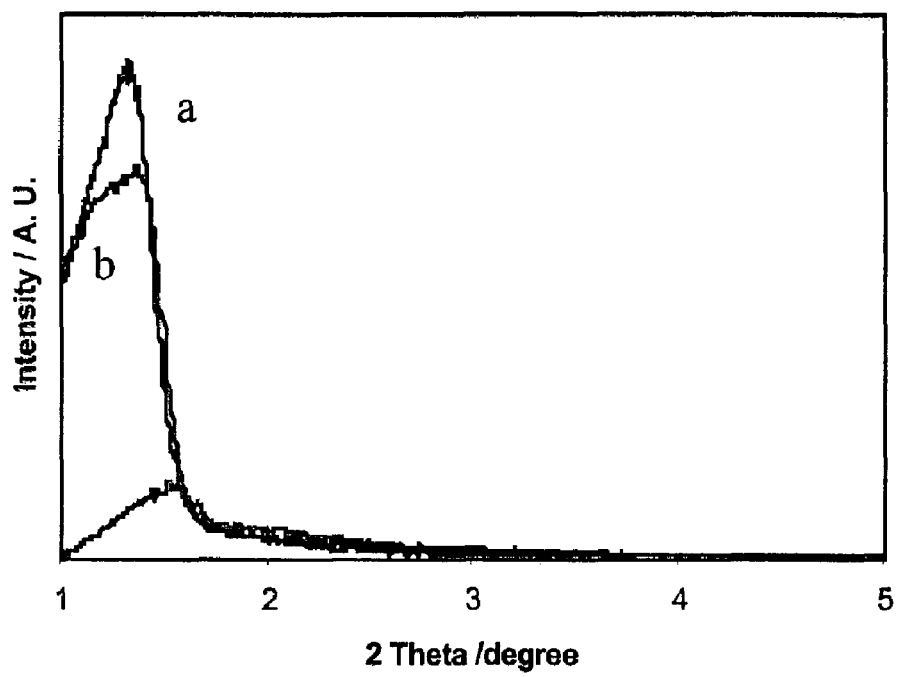
FIG. 5 shows XRD patterns of cubic mesoporous silica prepared using EO-PO block copolymer nonionic surfactant PLURONIC® F127 (trace A), a palladium silica nanocomposite prepared by electrodeposition fo palladium within the pores of the cubic mesoporous silica (trace B), an the palladium nanomesh obtained by dissolving away the silica from the nanocomposite (trace C)

FIG. 5 shows XRD patterns of the cubic mesoporous silica of Example 5A (trace A), the palladium silica nanocomposite prepared by electrodeposition of palladium within the pores of the cubic mesoporous silica of Example 5A (trace B), and the palladium nanomesh obtained by dissolving away the silica from the nanocomposite in Example 6A (trace C).

In FIG. 5, trace A exhibits one intense diffraction peak corresponding to a d-spacing of about 66.5 Angstroms, which can be indexed as a (211) face of a cubic structure (Im3m space group, a=166 Angstroms). As shown in trace B, the intensity of the peak decreased slightly after deposition of palladium in the pores. After removal of the silica (trace C), the resulting palladium nanomesh film had a broader diffraction peak.

Figure 6:
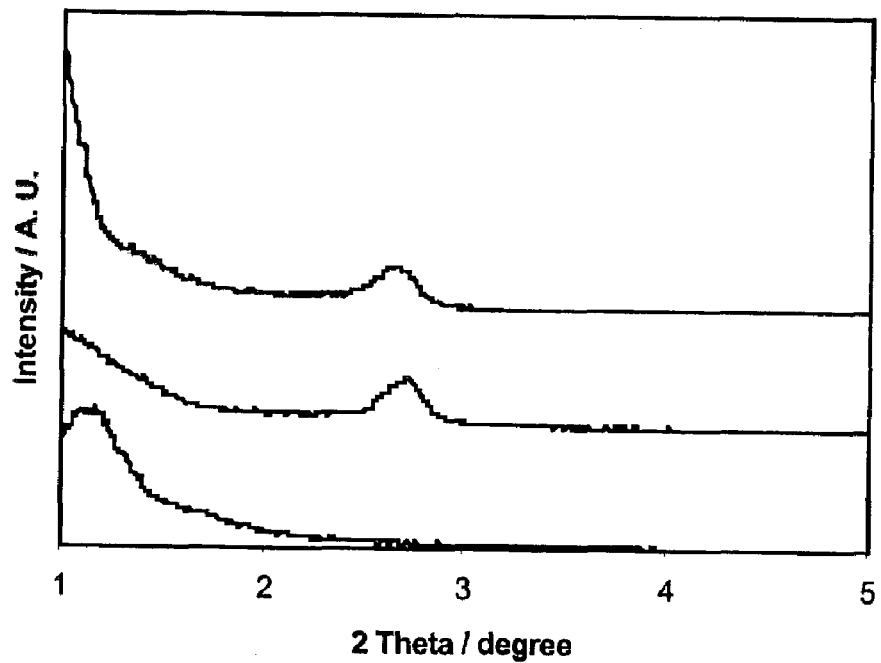
FIG. 6 shows XRD patterns of cubic mesoporous silica prepared using ethoxylated(20) cetyl alcohol surfactant BRIJ® 58 (trace A), a palladium silica nanocomposite prepared by electrodeposition fo palladium within the pores of the cubic mesoporous silica (trace B), and the palladium nanomesh obtained by dissolving away the silica from the nanocomposite (trace C)

FIG. 6 shows XRD patterns of cubic mesoporous silica of Example 5B (top trace), the palladium silica nanocomposite of Example 6B (middle trace), and the palladium nanomesh obtained by dissolving away the silica from the nanocomposite of Example 6B (bottom trace). After removal of the silica, a reflection peak corresponding to a d-spacing of about 68 Angstroms was observed.

Figure 7:
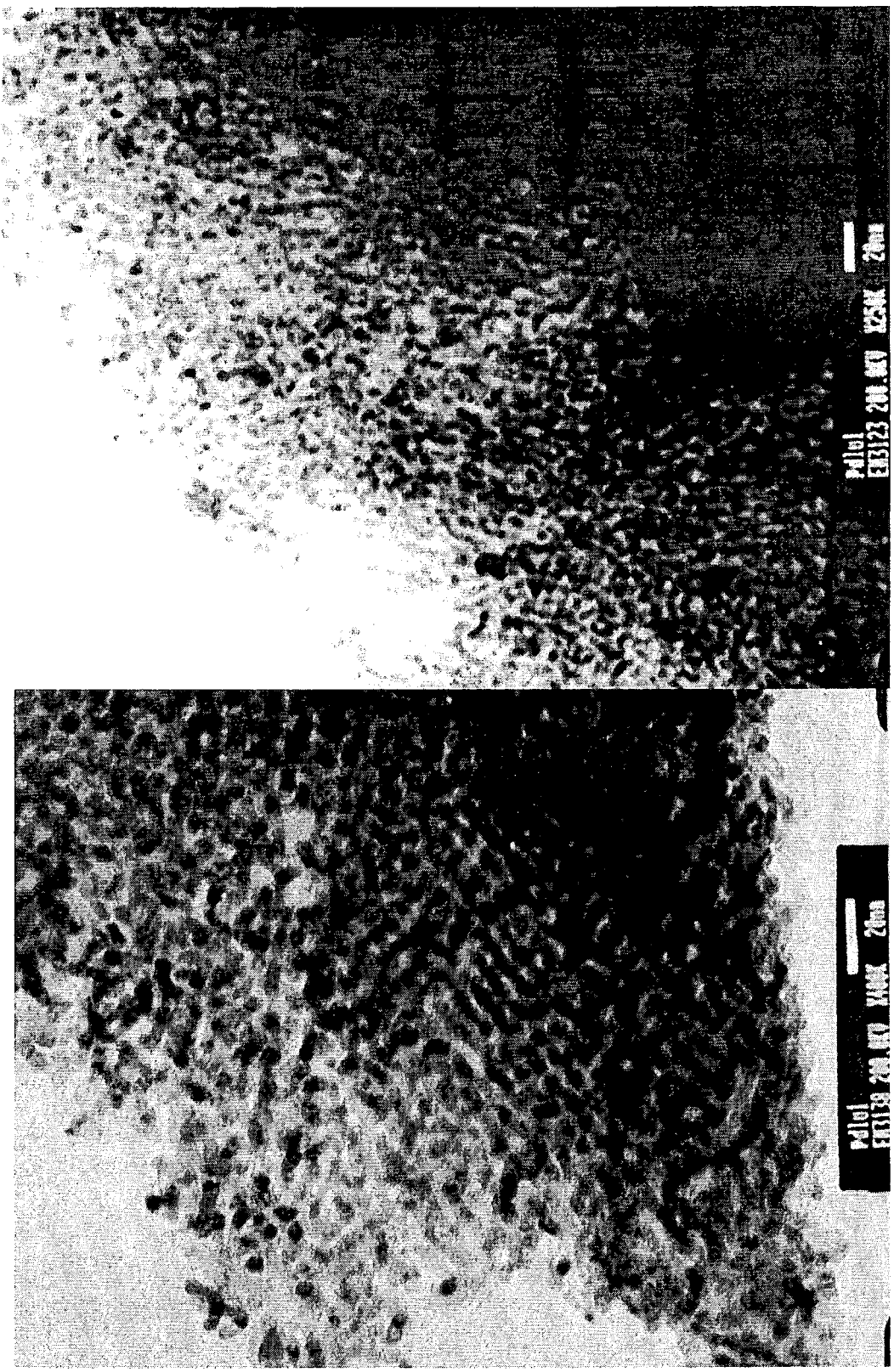
FIG. 7 depicts TEM images of the palladium nanomesh film of Example 5A.

FIG. 7 depicts TEM images of the palladium nanomesh film of Example 6A. A highly ordered mesh structure is evident.

Figure 8:
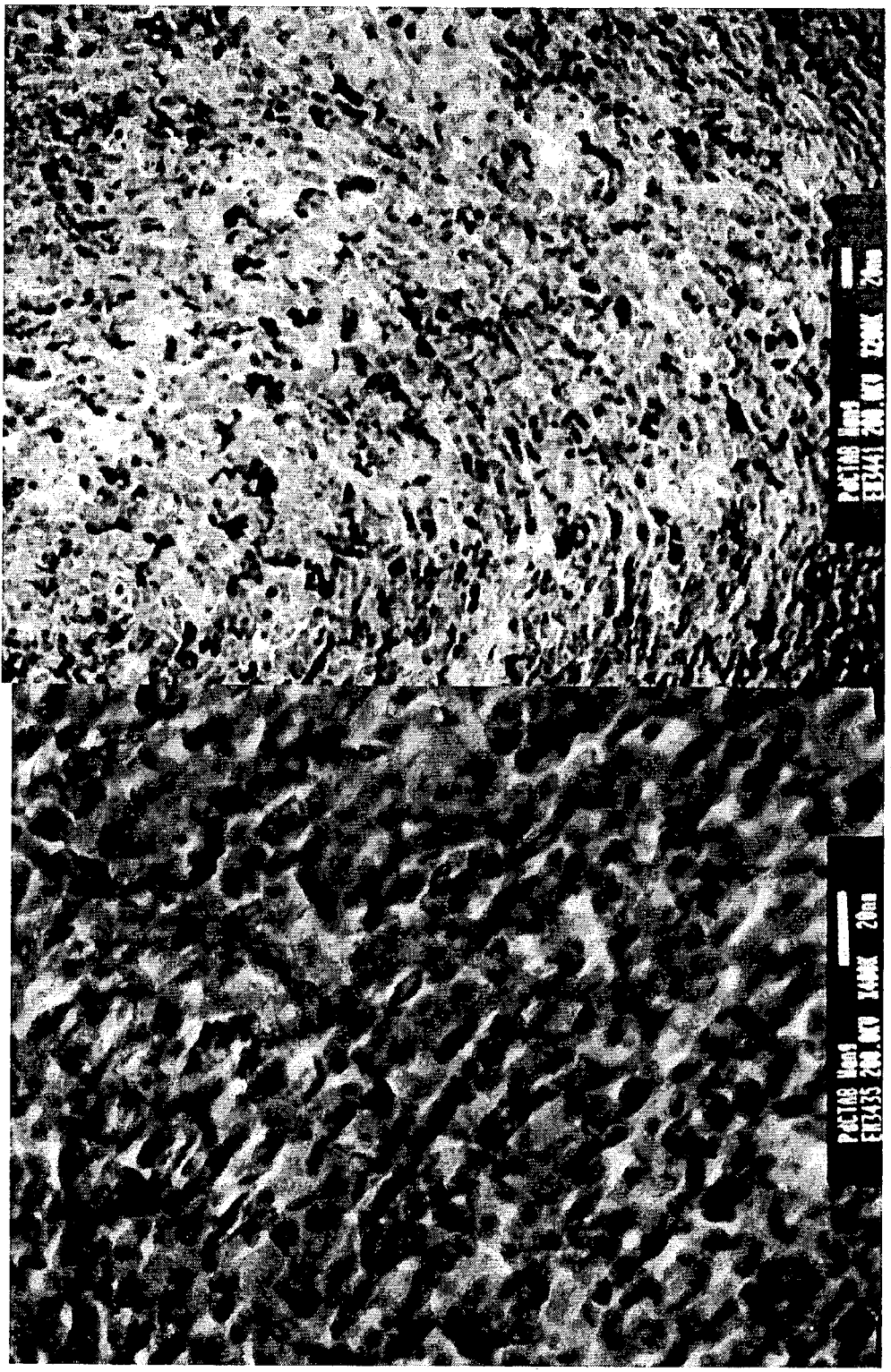
FIG. 8 depicts TEM images of the palladium nanomesh film of Example 5B.

FIG. 8 depicts TEM images of the palladium nanomesh film of Example 6B. The pattern is similar to that of the nanomesh of Example 6A except that the cross-sectional (transverse) dimension of the segments are somewhat smaller.

Figure 9:
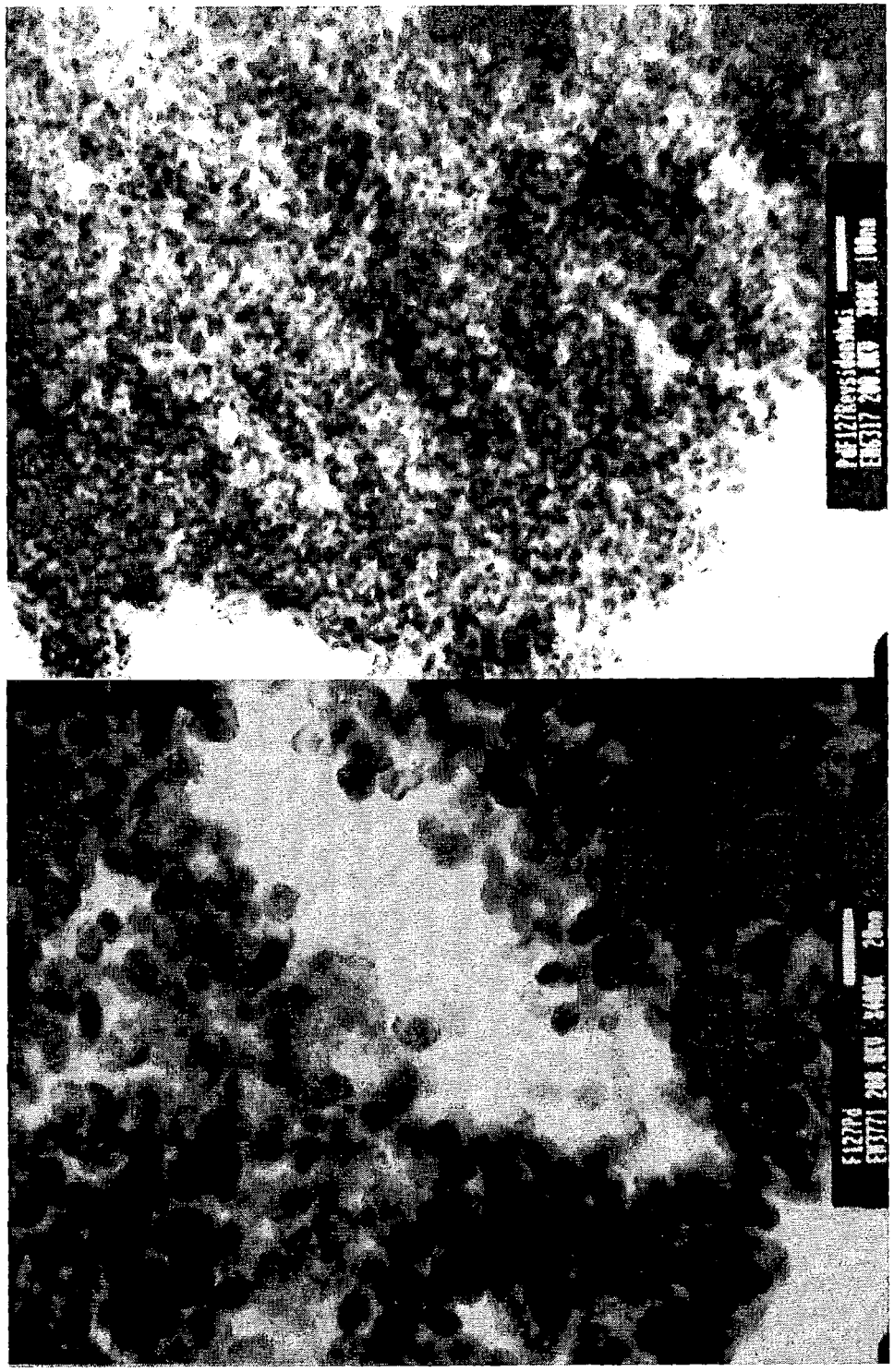
FIG. 9 depicts TEM images of a palladium nanomesh film of Example 5C.

FIG. 9 depicts TEM images of a palladium nanomesh film of Example 6C. In this case, the segments exhibit some spherical contour feathering.

Figure 10:
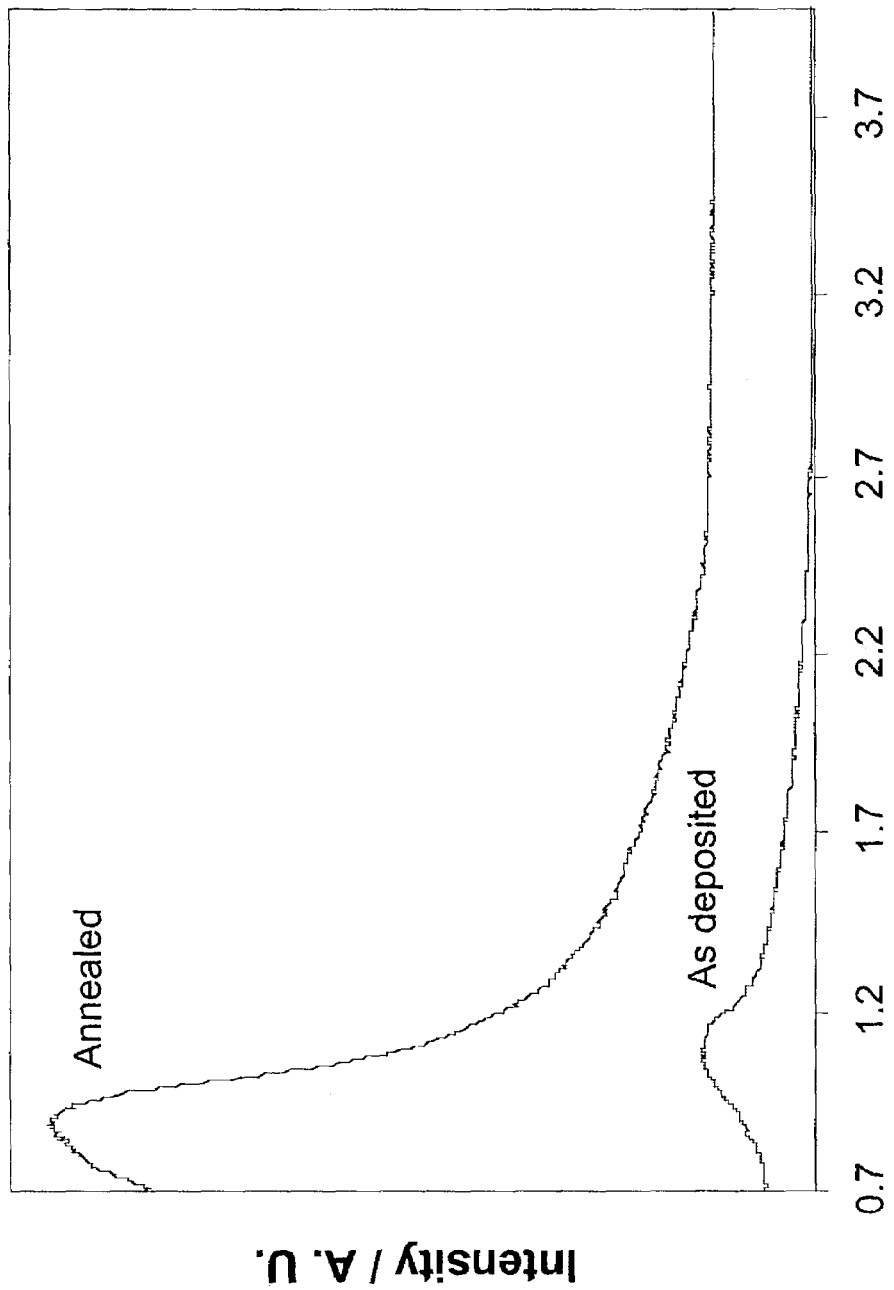
FIG. 10 shows XRD patterns for a palladium nanomesh film of the invention (labeled "annealed") in comparison with a film that has not been annealed (labeled "As deposited")

FIG. 10 shows XRD traces of the nanocomposite of Example 6C, before ("as deposited") and after annealing ("annealed"). As is evident from the XRD patterns, annealing dramatically increases the intensity of the diffraction peak. This indicates that the hierarchical structure in the palladium nanomesh is more uniform than in the non-annealed material. The increased uniformity correlates with improved mechanical strength and structural integrity, demonstrating the importance of annealing to the processes of the present invention.

EXAMPLE 7

Preparation of a Cadmium Selenide Nanomesh Thin Films

Glass plates containing a film of cubic mesoporous silica coated on a conductive layer of indium tin oxide (ITO) were prepared using BRIJ® 58 and PLURONIC® F127 surfactants as pore templates, as described in Examples 5A and 5B, to afford cubic mesoporous silica films having similar pore size and film thickness to those of Example 5A and 5B. The plating solutions contained about 0.1 to 1M $CdSO_4$, and about 0.1 to 10.0 mM $SeO_2$. The electrodeposition process was conducted in a conventional three-electrode cell immersed in 85° C. water bath, using a saturated calomel reference electrode (SCE) and a platinum wire counter-electrode. The plates of mesoporous silica on ITO were used as the working electrodes. The CdSe was deposited potentiostatically at −0.65 V vs. SCE reference electrode at 85° C. to form silica cadmium selenide nanocomposites. The nanocomposites were annealed at about 650° C. for about 15 minutes and cooled to room temperature under nitrogen. The silica removal was conducted with aqueous HF, as described above, to afford self-supporting cadmium selenide nanomesh films on ITO glass substrates.

Figure 11:
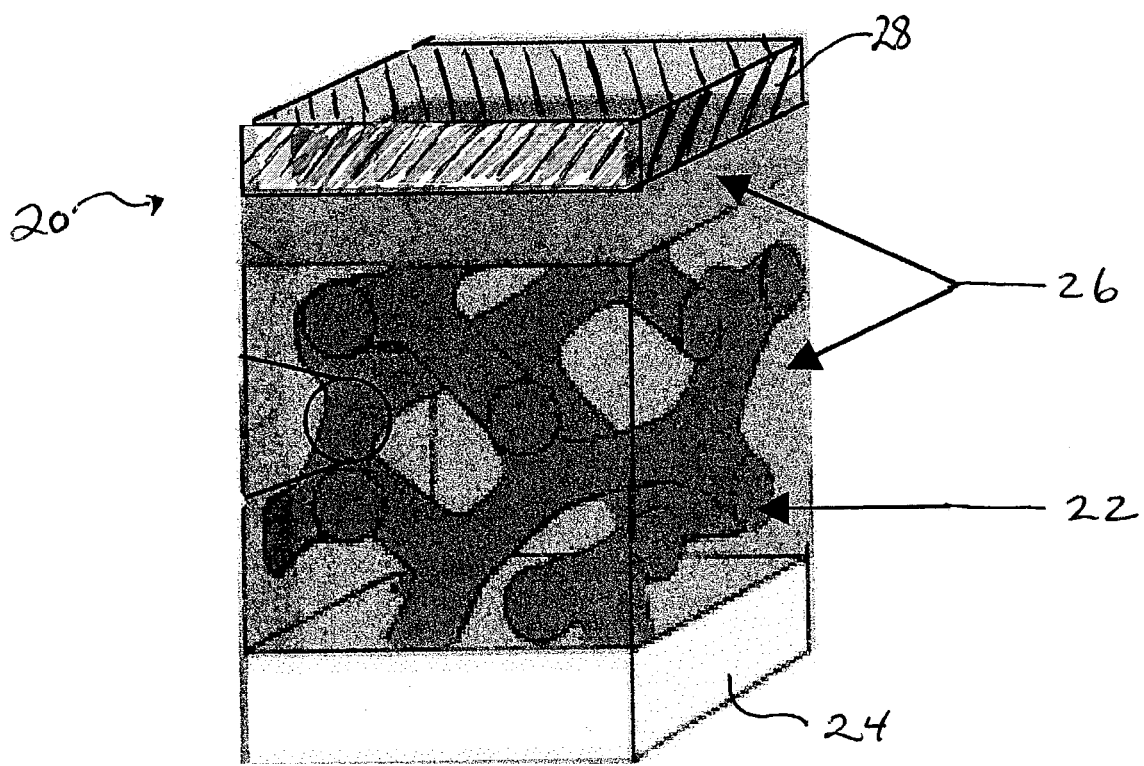
FIG. 11 is a schematic representation of a solar cell comprising a cadmium selenide nanomesh film of the present invention.

A self-supporting metal chalcogenide nanomesh film is useful as a photoelectronic component in a heterojunction photovoltaic device (e.g., a solar cell). FIG. 11 illustrates a heterojunction photovoltaic device 20 comprising a cadmium selenide nanomesh film of the present invention. A layer of Cadmium selenide nanomesh 22 is in contact with an optically transparent indium-tin oxide (ITO) substrate 24. The pores of the nanomesh are filled with a hole-transport agent 26 (e.g., a conductive polymer such as polythiophene). A reflective metallic layer 28 is coated over the nanomesh 22 and hole transport agent 26. Light entering through the ITO substrate 24 excites the semiconductive CdSe nanomesh 22, generating an electron, which is injected into the hole transport agent and migrates to the conductive metal layer 28, generating an electric current.

A self-supporting metal nanowire or nanomesh film, such as a palladium nanowire or nanomesh film, is useful as a sensor for hydrogen and other chemicals. A sensor device based on the nanowire or a nanomesh thin film can be prepared by depositing a self-supporting palladium nanowire or nanomesh thin film on a conductive substrate. When this device is exposed to hydrogen or another gas, for example, the interaction of the nanowire or nanomesh with the introduced gas changes the electrical resistance of the film in proportion to the concentration of the gas. Gas concentrations can be determined by a simple electrical resistance measurement on the nanostructured film.

The foregoing description is to be taken as illustrative, but not limiting. Still other variants within the spirit and scope of the present invention will readily present themselves to those skilled in the art.

We claim:

1. An annealed, self-supporting palladium nanowire film having a film thickness in the range of about 50 to about 1000 nm; wherein the film comprises an array of palladium nanowires, each wire having a diameter in the range of about 2 to about 20 nm.

2. An annealed, self supporting palladium nanomesh film having a film thickness in the range of about 50 to about 1000 nm; the film comprising a palladium nanomesh having a plurality of pores; and wherein the palladium nanomesh comprises a substantially interconnecting palladium nanosegment network having a plurality of interconnected nanowire segments, each nanowire segment having a transverse dimension in the range of about 2 to about 20 nm.

3. An annealed, self-supporting cadmium selenide nanomesh film having a film thickness in the range of about 50 to about 1000; the film comprising a cadmium selenide nanomesh having a plurality of pores; and wherein the cadmium selenide nanomesh comprises a substantially interconnecting cadmium selenide nanosegment network having a plurality of interconnected nanowire segments, each nanowire segment having a transverse dimension in the range of about 2 to about 20 nm.

* * * * *